(12) United States Patent
Xie et al.

(10) Patent No.: US 12,471,390 B2
(45) Date of Patent: Nov. 11, 2025

(54) PEROVSKITE MATERIAL BYPASS DIODE AND PREPARATION METHOD THEREFOR, PEROVSKITE SOLAR CELL MODULE AND PREPARATION METHOD THEREFOR, AND PHOTOVOLTAIC MODULE

(71) Applicant: LONGI GREEN ENERGY TECHNOLOGY CO., LTD., Shaanxi (CN)

(72) Inventors: Junjie Xie, Shaanxi (CN); Chen Xu, Shaanxi (CN); Zifeng Li, Shaanxi (CN); Zhao Wu, Shaanxi (CN); Tong Liu, Shaanxi (CN)

(73) Assignee: LONGI GREEN ENERGY TECHNOLOGY CO., LTD., Shaanxi (CN)

( * ) Notice: Subject to any disclaimer, the term of this patent is extended or adjusted under 35 U.S.C. 154(b) by 74 days.

(21) Appl. No.: 18/579,878

(22) PCT Filed: May 10, 2022

(86) PCT No.: PCT/CN2022/091970
§ 371 (c)(1),
(2) Date: Jan. 17, 2024

(87) PCT Pub. No.: WO2023/015994
PCT Pub. Date: Feb. 16, 2023

(65) Prior Publication Data
US 2024/0313139 A1    Sep. 19, 2024

(30) Foreign Application Priority Data
Aug. 10, 2021 (CN) .......................... 202110927793.1

(51) Int. Cl.
*H10F 19/70* (2025.01)
*H10F 19/90* (2025.01)
(Continued)

(52) U.S. Cl.
CPC ........... *H10F 19/70* (2025.01); *H10F 19/906* (2025.01); *H10F 71/128* (2025.01); *H10F 71/137* (2025.01); *H10F 77/935* (2025.01)

(58) Field of Classification Search
CPC ....... H10F 19/906; H10F 19/70; H10F 71/128
See application file for complete search history.

(56) References Cited

U.S. PATENT DOCUMENTS

2020/0295209 A1    9/2020    Bush

FOREIGN PATENT DOCUMENTS

| CN | 105428439 A  | 3/2016 |
| CN | 208507732 U  | 2/2019 |

(Continued)

OTHER PUBLICATIONS

International Search Report for Application No. PCT/CN2022/091970, mailed Jun. 29, 2022 (4 pages).

(Continued)

*Primary Examiner* — Sadie White
(74) *Attorney, Agent, or Firm* — NIXON PEABODY LLP; Jeffrey L. Costellia

(57) ABSTRACT

A perovskite material bypass diode and a manufacturing method therefor, a perovskite solar cell module and a manufacturing method therefor, and a photovoltaic module are disclosed by the present application, which relate to the technical field of photovoltaics, the difficulty of manufacturing the perovskite material bypass diode is reduced. The method for manufacturing the perovskite material bypass diode includes: providing a layer of a perovskite material layer, processing the perovskite material layer to form a P-type perovskite material region and an N-type perovskite material region, so that a perovskite material bypass diode is formed. The perovskite material bypass diode and the manufacturing method therefor, the perovskite solar cell module (Continued)

and the manufacturing method therefor, and the photovoltaic module provided by the present application are used to manufacture the photovoltaic module.

20 Claims, 5 Drawing Sheets

(51) Int. Cl.
  *H10F 71/00* (2025.01)
  *H10F 77/00* (2025.01)

(56) References Cited

FOREIGN PATENT DOCUMENTS

| | | |
|---|---|---|
| CN | 110335946 A | 10/2019 |
| CN | 111430480 A | 7/2020 |
| CN | 113690374 A | 11/2021 |
| EP | 3654389 A1 | 5/2020 |
| JP | 2017-526176 A | 9/2017 |
| KR | 10-2018-0088117 A | 8/2018 |

OTHER PUBLICATIONS

Wang et al., "Qualifying composition dependen p and n self-doping in CH3NH3PbI3", Applied Physics Letters, 2014, vol. 105, pp. 163508-1-163508-5.

Cui et al., "Planar p-n homojunction perovskite solar cells with efficiency exceeding 21.3%", Nature Energy, 2019, vol. 4, pp. 150-159.

Japanese Notice of Reasons for Refusal for Application No. 2024-508438, mailed Dec. 26, 2024, (6 pages).

Cui et al., "Planary p-n homojunction perovskite solar cells with efficiency exceeding 21.3%", Articles, Nature Energy, vol. 4, Feb. 2019, pp. 150-159.

Bowring et al., "Reverse Bias Behavior of Halide Perovskite Solar Cells", Advanced Energy Materials, No. 8, 2018, 1702365, pp. 1-7.

Park et al., "Scalable fabrication and coating methods for perovskite solar cells and solar modules", Nature Reviews, Materials, vol. 5, May 2020, pp. 333-350.

Xu et al., "Structural Design for Efficient Perovskite Solar Modules", Advanced Science News, Sol. RRL 2021, vol. 5, 2000733, pp. 1-6.

Supplementary European Search Report for Application No. 22854987.9, mailed Oct. 14, 2024 (16 pages).

PEROVSKITE MATERIAL BYPASS DIODE AND PREPARATION METHOD THEREFOR, PEROVSKITE SOLAR CELL MODULE AND PREPARATION METHOD THEREFOR, AND PHOTOVOLTAIC MODULE

CROSS-REFERENCE TO RELATED APPLICATION

The present disclosure claims the priority of the Chinese patent application filed on Aug. 10, 2021 before the China National Intellectual Property Administration with the application number of 202110927793.1 and the title of "PEROVSKITE MATERIAL BYPASS DIODE AND PREPARATION METHOD THEREFOR, PEROVSKITE SOLAR CELL MODULE AND PREPARATION METHOD THEREFOR, AND PHOTOVOLTAIC MODULE", which is incorporated herein in its entirety by reference.

TECHNICAL FIELD

The present disclosure relates to the technical field of photovoltaics and, more particularly, to a perovskite material bypass diode and a manufacturing method therefor, a perovskite solar cell module and a manufacturing method therefor, and a photovoltaic module.

BACKGROUND

Semiconductor materials such as silicon and germanium and so on are generally used as the material of the existing perovskite material bypass diode, and by various steps such as thin film deposition and photolithography and so on, a PN junction structure of the perovskite material bypass diode is formed.

In the existing manufacturing process of the perovskite material bypass diode, more high temperature and high vacuum deposition devices are needed to be used, and the manufacturing process is more complicated. Moreover, the photolithography and other processes of the manufacturing processing have extremely high requirements on the process and devices.

SUMMARY

The object of the present application aims at providing a perovskite material bypass diode and a manufacturing method therefor, a perovskite solar cell module and a manufacturing method therefor, and a photovoltaic module, the difficulty of manufacturing the perovskite material bypass diode is reduced.

In a first aspect, a method for manufacturing a perovskite material bypass diode is provided by the present application. The method for manufacturing the perovskite material bypass diode includes: providing a layer of a perovskite material layer, processing the perovskite material layer to form a P-type perovskite material region and an N-type perovskite material region, so that a perovskite material bypass diode is formed.

When the technical solution stated above is used, in view of the crystal structure of the perovskite material having the characteristics of "soft lattice", at a lower temperature (below 300° C.), the P-type perovskite material or the N-type perovskite material can be formed by simple atmosphere heat treating, ion diffusion and other processes. By means of heat treating, the conducting type of the perovskite material can be converted between P-type and N-type. Based on this, the perovskite material layer can be conveniently processed to form the P-type perovskite material region and the N-type perovskite material region by the simple processes such as heat treating. At this moment, the process of manufacturing the perovskite material bypass diode is simple and the cost is low, the manufacturing difficulty can be greatly reduced and the industrial application of the perovskite material bypass diode in the photovoltaic, the light-emitting diode, the detector and many other applications is facilitated.

In addition, when the perovskite material bypass diode is applied in the perovskite solar cell module, the perovskite material layer originally existing in the perovskite solar cell module can be used to manufacture the perovskite material bypass diode in situ. At this moment, a perovskite material bypass diode can be configured for each perovskite cell in the perovskite solar cell module manufactured by the scribing process, the hot spot effect and the attenuation of the energy conversion efficiency are avoided, and the stability and the lifetime of the perovskite cell are improved.

In some embodiments, a general formula of a perovskite material of the perovskite material layer is $ABX_3$, wherein A is a monovalent cation, B is a divalent cation, and X is a monovalent anion; and a content of AX of the P-type perovskite material region is greater than a content of $BX_2$ of the P-type perovskite material region, and a content of AX of the N-type perovskite material region is less than a content of $BX_2$ of the N-type perovskite material region. At this moment, by adjusting the content of the AX and the content of the $BX_2$, the conducting type of the perovskite material can be conveniently adjusted, and then the PN junction structure of the perovskite material layer can be conveniently manufactured.

In some embodiments, the step of processing the perovskite material layer includes: heating a local part of the perovskite material layer to form the N-type perovskite material region, and/or in an AX atmosphere, heat treating the local part of the perovskite material layer to form the P-type perovskite material region. The heating and heat treating in the AX atmosphere are simple process methods. By using these simple process methods, the perovskite material layer is partially processed, the PN junction structure of the perovskite material bypass diode can be easily and quickly manufactured.

In a second aspect, the perovskite material bypass diode obtained by using the method for manufacturing the perovskite material bypass diode described in the first aspect or any embodiment of the first aspect.

The beneficial effects of the perovskite material bypass diode provided by the second aspect may be referred to the beneficial effects of the method for manufacturing the perovskite material bypass diode described in the first aspect or any embodiment of the first aspect, which is not repeated here.

In a third aspect, a perovskite solar cell module is provided by the present application, wherein the perovskite solar cell module includes a plurality of perovskite cells connected in series and at least one perovskite material bypass diode connected in parallel with the plurality of the perovskite cells; wherein the at least one perovskite material bypass diode is obtained by processing the perovskite material layer to form a P-type perovskite material region and an N-type perovskite material region.

When the technical solution stated above is used, the perovskite solar cell module includes the at least one perovskite material bypass diode, and the perovskite material bypass diode is connected in parallel with the perovskite cell. When the perovskite cell in the perovskite solar cell module can work normally for photoelectric conversion, the perovskite material bypass diode is not switched on, and the photogenerated electrons and the photogenerated holes are transported in the plurality of perovskite cells connected in series. When there are problems such as degrading or decomposing and other failure problems in the perovskite material layer (the perovskite material) of the perovskite cell connected in parallel with the perovskite material bypass diode in the perovskite solar cell module, the failed perovskite cell is bypassed by the perovskite material bypass diode. At this moment, the perovskite material bypass diode connected in parallel with the failed perovskite cell is connected in series and switched on with the perovskite cell before and after the perovskite material bypass diode, and the current (the photogenerated electrons and the photogenerated holes) of the perovskite solar cell module is transported by the perovskite material bypass diode. Based on this, the power loss caused by that the current is transported by the failed perovskite cell can be avoided, thus the conversion efficiency of the perovskite solar cell module can be improved.

In addition, since the bypass diode is a perovskite material bypass diode, the PN junction can be conveniently manufactured by using the P-type perovskite material and the N-type perovskite material to form the perovskite material bypass diode. Moreover, the material of the perovskite material bypass diode is the same as the material of the perovskite material layer of the perovskite cell. The perovskite material bypass diode can be manufactured while manufacturing the perovskite material layer or the perovskite material bypass diode can be manufactured by using the perovskite material layer.

In some embodiments, a quantity of the at least one perovskite material bypass diode is equal to a quantity of the plurality of perovskite cells, the at least one perovskite material bypass diode is connected in parallel with the plurality of perovskite cells in a one to one corresponding way. At this moment, each perovskite cell in the perovskite solar cell module can be configured with a perovskite material bypass diode. No matter which perovskite cell fails, it can be bypassed by its parallel perovskite material bypass diode, thereby the failed perovskite cell is avoided from consuming electric energy. Based on this, the entire perovskite solar cell module can be performed being protected from failure.

In some embodiments, a general formula of a perovskite material of each perovskite material bypass diode is $ABX_3$, wherein A is a monovalent cation, B is a divalent cation, and X is a monovalent anion; and a content of AX of the P-type perovskite material region of the each perovskite material bypass diode is greater than a content of $BX_2$ of the P-type perovskite material region of the perovskite material bypass diode, and a content of AX of the N-type perovskite material region of the each perovskite material bypass diode is less than a content of $BX_2$ of the N-type perovskite material region of the each perovskite material bypass diode. At this moment, by adjusting the content of the AX and the content of the $BX_2$, the conducting type of the perovskite material can be conveniently adjusted, and then the PN junction structure of the perovskite material bypass diode can be conveniently manufactured.

In some embodiments, each perovskite material bypass diode is disposed between a positive electrode and a negative electrode of each perovskite cell. At this moment, the two electrodes of the perovskite material bypass diode can be electrically contacted directly with the two electrodes of the perovskite cell without the need of the auxiliary connection of other structures, thus the structure can be simplified. The P-type perovskite material region of the each perovskite material bypass diode is electrically connected to the negative electrode of the each perovskite cell, and the N-type perovskite material region of the each perovskite material bypass diode is electrically connected to the positive electrode of the each perovskite cell. At this moment, the current direction of the perovskite material bypass diode and the current direction of the perovskite cell connected in parallel with the perovskite material bypass diode are the same. The parallel connection of the perovskite material bypass diode and the perovskite cell can be realized.

In some embodiments, a cross section of the each perovskite material bypass diode is rectangular, triangular or trapezoidal. At this moment, the perovskite material bypass diodes with different shapes and sizes can be disposed according to the circuit design of the perovskite solar cell module.

In some embodiments, the perovskite solar cell module further includes an electric isolation wall, the electric isolation wall is disposed between each perovskite material bypass diode and the perovskite material layer of each perovskite cell, wherein, a material of the electric isolation wall includes any one of a dielectric material, a ceramic insulating material or an organic insulating material. At this moment, the insulation isolation between the perovskite material bypass diode and the perovskite material layer can be realized by using the electric isolation wall, the problems such as the electric leakage of the perovskite material bypass diode and the perovskite material layer are avoided, and the bypass performance of the perovskite material bypass diode can be improved.

In some embodiments, each perovskite material bypass diode is manufactured by heat treating an edge part of the perovskite material layer of each perovskite cell. At this moment, during the manufacturing process of the perovskite cell, a part of the region can be separated from the perovskite material layer, by the post-processing, a perovskite material bypass diode with a PN junction can be constructed in this part of the region. This method of manufacturing the perovskite material bypass diode can be compatible with the existing scribing module process, it is only needed to add a few simple steps that the manufacturing of the perovskite material bypass diode can be realized, and the process is simple and easy. Moreover, this method has less improvement on the existing process and the less increasing cost, and is convenient for production and application.

In a fourth aspect, a method for manufacturing a perovskite solar cell module is provided by the present application, wherein the method for manufacturing the perovskite solar cell module includes steps as follows:
  providing a module base plate, wherein the module base plate includes a function layer, the function layer includes a perovskite material layer;
  partially exposing the perovskite material layer, and processing an exposed part of the perovskite material layer to form a P-type perovskite material region and an N-type perovskite material region, so that the perovskite material bypass diode is formed;
  wherein the perovskite material bypass diode is connected in parallel with a perovskite cell of the perovskite solar cell module.

When the technical solution stated above is used, during a process of manufacturing a perovskite solar cell module, the perovskite material layer originally existing in the perovskite solar cell module can be used, after the perovskite material layer is partially exposed and processed, a PN junction structure of the perovskite material bypass diode is formed. That is, the perovskite material bypass diode is manufactured in situ on the perovskite material layer. At this moment, the process of manufacturing the perovskite material bypass diode can be better combined with the scribing process, and a perovskite material bypass diode is configured for each perovskite cell, the hot spot effect and the attenuation of the energy conversion efficiency are avoided, and the stability and the lifetime of the perovskite cell are improved.

In some embodiments, the perovskite material bypass diode is connected in parallel with the perovskite cell of the perovskite solar cell module in a one to one corresponding way.

In some embodiments, after providing the module base plate and before partially exposing the perovskite material layer, the method for manufacturing the perovskite solar cell module further includes: opening a series groove on the module base plate; forming at least one electric isolation wall on the module base plate; each electric isolation wall being located in a region where the perovskite cell is located, and dividing a function layer of the perovskite cell into a cell region and a bypass diode region, and then forming a second electrode layer filling the series groove on the module base plate.

In some embodiments, partially exposing the perovskite material layer includes: opening a separating groove separating adjacent perovskite cells on the second electrode layer, extending the separating groove to an interior of the perovskite material layer, so that the perovskite material layer of each bypass diode region is partially exposed. At this moment, by opening a separating groove, it can be convenient to partially expose the perovskite material layer of the bypass diode region, so that it is convenient for subsequent processing the exposed part of the perovskite material layer.

In some embodiments, forming the at least one electric isolation wall on the module base plate includes: opening at least one electric isolation groove on the module base plate, wherein each electric isolation groove runs through the function layer; filling an insulating material in the each electric isolation groove to form the each electric isolation wall; wherein a way of filling the insulating material is deposition, evaporation or printing; and a way of opening the series groove and a way of opening the at least one electric isolation groove are selected from chemical etching, laser scribing cutting or mechanical scribing. At this moment, by means of opening the electric isolation groove and filling the insulating material, the function layer of the perovskite cell can be conveniently divided into the bypass diode region and the cell region. Moreover, opening the electric isolation groove and opening the series groove can be carried out synchronously, and the process is simple and easy.

In some embodiments, a width of the series groove ranges from 10 μm to 100 μm, a width of each electric isolation groove ranges from 5 μm to 50 μm; a distance between the each electric isolation groove and the series groove ranges from 20 μm to 200 μm. At this moment, the electric isolation wall formed by the electric isolation groove has a sufficient width and can play a better role in insulation isolation. And there is enough space between the electric isolation groove and the series groove, which is convenient for setting the separating groove separating the perovskite cell.

In some embodiments, on a same electrode block, the separating groove is located between the series groove and the electric isolation wall. At this moment, while separating the two perovskite cells, the separating groove separates the series groove of the former perovskite cell from the perovskite material bypass diode of the latter perovskite cell.

A depth of the separating groove extending to the interior of the perovskite material layer is greater than or equal to 30% of a thickness value of the perovskite material layer and less than or equal to 70% of the thickness value of the perovskite material layer. At this moment, the bypass diode region is divided into two parts, one part is exposed and the other part is still shielded by a material of the bottom of the separating groove. These two parts correspond to the P region and the N region of the perovskite material bypass diode, respectively. Moreover, the volume difference between the P region and the N region is small, a PN junction with a better function can be ensured to be formed, and the dysfunction caused by the large volume difference is avoided.

In some embodiments, a width of the separating groove ranges from 10 μm to 100 μm.

In some embodiments, the exposed part of the perovskite material layer is the exposed part of the perovskite material layer of the bypass diode region; processing the exposed part of the perovskite material layer includes:

increasing a content of AX of the exposed part of the perovskite material layer of the bypass diode region, or reducing the content of the AX of the exposed part of the perovskite material layer of the bypass diode region. In view of that the ratio of the AX to the $BX_2$ in the perovskite material can be used to adjust the conducting type of the perovskite material, by using the way of changing the content of the AX, the ratio of the AX to the $BX_2$ can be conveniently adjusted to form the PN junction.

In some embodiments, processing the exposed part of the perovskite material layer includes:

heating the exposed part of the perovskite material layer of the bypass diode region to form the N-type perovskite material region of the perovskite material bypass diode; or in an AX atmosphere, heat treating the exposed part of the perovskite material layer of the bypass diode region to form the P-type perovskite material region of the perovskite material bypass diode. In view of that the binding force of the AX in the perovskite lattice is not too strong, the AX can be released from the perovskite material by the way of heating treatment to form the N-type perovskite material. By heat treating in the AX atmosphere, the AX can be injected into the perovskite material to form the P-type perovskite material. By treating the exposed part of the perovskite material layer of the bypass diode region, the PN junction can be easily and quickly manufactured.

In some embodiments, after forming the perovskite material bypass diode, the method for manufacturing the perovskite solar cell module further includes: deepening the separating groove to form the perovskite solar cell module.

In some embodiments, the module base plate includes a substrate, a first electrode layer and a function layer successively arranged in layer configuration; the first electrode layer includes a plurality of electrode blocks separately distributed on the substrate; and the function layer further includes a first carrier transport layer and a second carrier transport layer; the first carrier transport layer is located between the first electrode layer and the perovskite material layer, and the second carrier transport layer is located on the surface of the perovskite material layer away from the first electrode layer. At this moment, the first carrier transport layer and the second carrier transport layer can be set according to the design needs of the perovskite cell.

In some embodiments, providing the module base plate includes:

providing a substrate having a conducting layer;

opening a first slot running through the conducting layer on the substrate and forming the first electrode layer; and forming the function layer on the first electrode layer, wherein the function layer is covered on the plurality of electrode blocks of the first electrode layer and the substrate between the plurality of electrode blocks.

In a fifth aspect, a photovoltaic module is provided by the present application, the photovoltaic module includes the perovskite solar cell module described by at least one third aspect and any embodiment of the third aspect.

The beneficial effects of the photovoltaic module provided by the fifth aspect may be referred to the beneficial effects of the perovskite solar cell module described in the third aspect or any embodiment of the third aspect, which is not repeated here.

BRIEF DESCRIPTION OF THE DRAWINGS

The figures described here are used to provide a further understanding of the present application and constitute a part of the present application. The indicative embodiments and their explanations of the present application are used to explain the present application, which does not constitute an improper limitation of the present application. In the figures:

Reference numerals: in FIG. 1 to FIG. 14, 10—perovskite cell, 11—substrate, 12—first electrode layer, 121—electrode block, 13—first carrier transport layer, 14—perovskite material layer, 15—second carrier transport layer, 16—second electrode layer, 20—perovskite material bypass diode, 30—electric isolation wall, 41—first slot, 42—series groove, 43—electric isolation groove, 440—separating groove, 44—second slot and 50—AX atmosphere.

DETAILED DESCRIPTION

Figure 1:
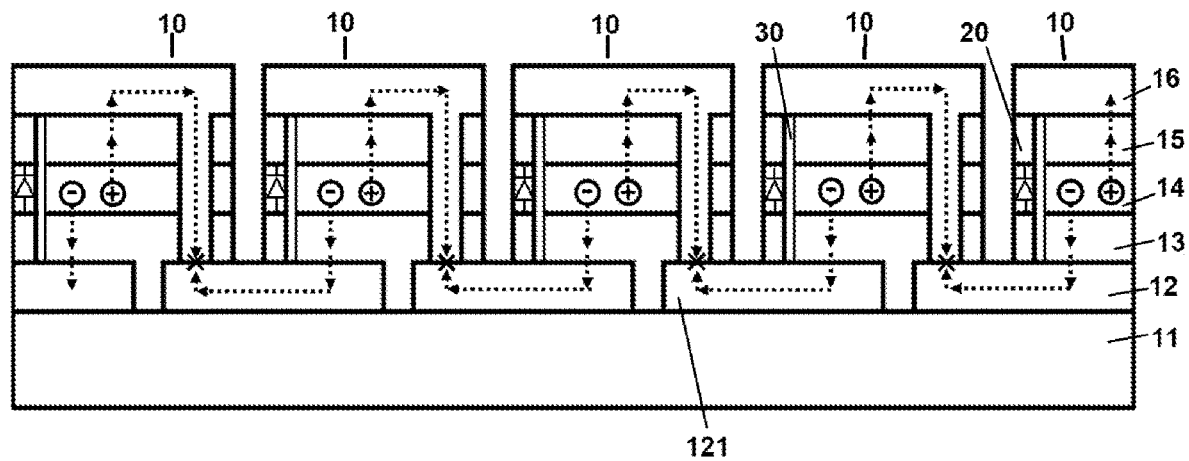
FIG. 1 is a schematic diagram of a structure of a perovskite solar cell module according to the embodiments of the present application.

In order to facilitate a clear description of the technical solution of the embodiments of the present application, in the embodiments of the present application, the words "first" and "second" etc. are used to distinguish the same items or similar items with basically the same functions and roles. A person skilled in the art can understand that the words "first" and "second" etc. do not limit the number and execution order, and the words "first" and "second" etc. are not limited to that they must be different.

In the description of the present application, it is necessary to understand that the orientation or positional relationship indicated by the terms "up", "down", "front", "back", "left", "right", etc. is based on the orientation or positional relationship shown in the figures. It is only to facilitate the description and simplify the description of the present application, rather than to indicate or imply that the device or component referred to must have a specific orientation, be constructed and operated in a specific orientation, so it cannot be understood as a limitation on the present application.

It should be noted that, in the present application, the words "illustrative" or "for example" etc. are used to mean giving examples, illustration or explanations. Any embodiment or designing solution described as "exemplar" or "for example" in the present application should not be interpreted as being more preferred or advantageous than other embodiments or designing solutions. Specifically, the use of words such as "exemplar" or "for example" etc. aims to present relevant concepts in a specific way.

In the present disclosure, "at least one" refers to one or more, and "multiple" refers to two or more. An expression "and/or" which describes a relationship of related objects means that there can be three relationships, for example, an expression "A and/or B" can refer to A alone, A and B, and B alone, where A and B can be in a singular or plural form. A character "/" generally indicates an "or" relationship for contextual objects. An expression "at least one of following ones (items)" or its similar expression refers to any combination of these items, including any combination of single one (item) or plural items (ones). For example, at least one of a, b or c can refer to: a, b, c, combination of a and b, combination of a and c, combination of b and c, or combination of a, b and c, where a, b and c can be in a singular or plural form.

In order to solve the problem that the manufacturing process of the perovskite material bypass diode is complex, a method for manufacturing a perovskite material bypass diode is provided by the embodiments of the present application. The method for manufacturing the perovskite material bypass diode includes: providing a layer of a perovskite material layer, processing the perovskite material layer to form a P-type perovskite material region and an N-type perovskite material region, so that a perovskite material bypass diode is formed.

Based on the manufacturing method stated above, in view of the crystal structure of the perovskite material having the characteristics of "soft lattice", at a lower temperature (below 300° C.), the P-type perovskite material or the N-type perovskite material can be formed by simple atmosphere heat treating, ion diffusion and other processes. By means of heat treating, the conducting type of the perovskite material can be converted between P-type and N-type. Based on this, the perovskite material layer can be conveniently processed to form the P-type perovskite material region and the N-type perovskite material region by the simple processes such as heat treating. At this moment, the process of manufacturing the perovskite material bypass diode is simple and the cost is low, the manufacturing difficulty can be greatly reduced and the industrial application of the perovskite material bypass diode in the photovoltaic, the light-emitting diode, the detector and many other applications is facilitated.

In addition, when the perovskite material bypass diode is applied in the perovskite solar cell module, the perovskite material layer originally existing in the perovskite solar cell module can be used to manufacture the perovskite material bypass diode in situ. At this moment, a perovskite material bypass diode can be configured for each perovskite cell in the perovskite solar cell module manufactured by using the scribing process, the hot spot effect and the attenuation of the energy conversion efficiency are avoided, and the stability and the lifetime of the perovskite cell are improved.

A general formula of a perovskite material of the perovskite material layer is $ABX_3$, wherein A is a monovalent cation, B is a divalent cation, and X is a monovalent anion. Specifically, A may be at least one of $FA^+$, $MA^+$ or $Cs^+$, B can be at least one of $Pb^{2+}$ or $Sn^{2+}$, X can be at least one of $Cl^-$, $Br^-$ or $I^-$. At this moment, the PN junction can be conveniently formed by using that the P-type perovskite material contacts with the N-type perovskite material.

A content of AX of the P-type perovskite material region stated above is greater than a content of $BX_2$ of the P-type perovskite material region, and a content of AX of the N-type perovskite material region is less than a content of $BX_2$ of the N-type perovskite material region. The $ABX_3$ perovskite material is usually composed of the AX and the $BX_2$. When the content of the $BX_2$ is greater than the content of the AX, the perovskite material is the N-type perovskite material; when the content of the AX is greater than the content of the $BX_2$, the perovskite material is the P-type perovskite material. Based on the material characteristics that the ratio of the AX to the $BX_2$ in the $ABX_3$ perovskite material is easy to control, the P-type perovskite material and the N-type perovskite material can be easily manufactured by adjusting the ratio of the AX to the $BX_2$ in the perovskite material to form a perovskite material bypass diode 20 with a PN junction.

The way to provide the layer of the perovskite material layer can be coating, deposition, sputtering, etc.

The step of processing the perovskite material layer includes: heating a local part of the perovskite material layer to form the N-type perovskite material region, and/or in an AX atmosphere, heat treating the local part of the perovskite material layer to form the P-type perovskite material region. The heating and heat treating in the AX atmosphere are simple process methods. By using these simple process methods, the perovskite material layer is partially processed, the PN junction structure of the perovskite material bypass diode can be easily and quickly manufactured. The process of processing the perovskite material layer is described in detail below in combination with the perovskite solar cell module.

The perovskite material bypass diode obtained by using the method for manufacturing the perovskite material bypass diode stated above is further provided by the embodiments of the present application. The beneficial effects of the perovskite material bypass diode may be referred to the beneficial effects of the method for manufacturing the perovskite material bypass diode stated above, which is not repeated here.

A perovskite solar cell module is further provided by the embodiments of the present application. As shown in FIG. 1, the perovskite solar cell module includes a plurality of perovskite cells 10 connected in series and at least one perovskite material bypass diode 20 connected in parallel with the plurality of the perovskite cells; wherein the at least one perovskite material bypass diode is obtained by processing the perovskite material layer to form a P-type perovskite material region and an N-type perovskite material region.

Figure 2:
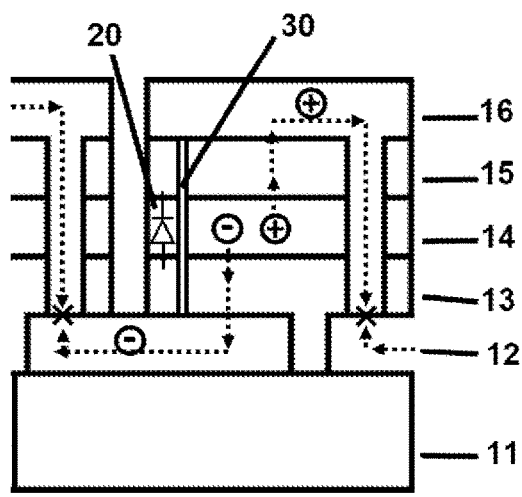
FIG. 2 is a schematic diagram of normal operation of the perovskite cell of the perovskite solar cell module according to the embodiments of the present application.
Figure 3:
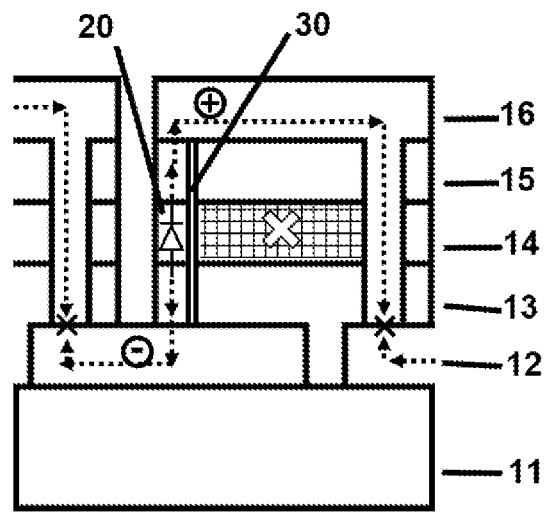
FIG. 3 is a working schematic diagram when the perovskite cell in the perovskite solar cell module is failed according to the embodiments of the present application.

Based on the structure stated above, it can be seen that the perovskite solar cell module includes the at least one perovskite material bypass diode 20, and the perovskite material bypass diode 20 is connected in parallel with the perovskite cell 10. As shown in FIG. 1 and FIG. 2, the dotted lines in the figures indicate the flowing directions of the photogenerated electrons and the photogenerated holes. When the perovskite cell 10 in the perovskite solar cell module can work normally for photoelectric conversion, the perovskite material bypass diode 20 is not switched on, and the photogenerated electrons and the photogenerated holes are transported in the plurality of perovskite cells 10 connected in series. As shown in FIG. 3, when there are problems such as degrading or decomposing and other failure problems in the perovskite material layer 14 (the perovskite material) of the perovskite cell 10 connected in parallel with the perovskite material bypass diode 20 in the perovskite solar cell module, the failed perovskite cell 10 is bypassed by the perovskite material bypass diode 20. At this moment, the perovskite material bypass diode connected in parallel with the failed perovskite cell 10 is connected in series and switched on with the perovskite cell 10 before and after the perovskite material bypass diode 20, and the current (the photogenerated electrons and the photogenerated holes) of the perovskite solar cell module is transported by the perovskite material bypass diode 20. Based on this, the power loss caused by that the current is transported by the failed perovskite cell can be avoided, thus the conversion efficiency of the perovskite solar cell module can be improved.

In addition, since the bypass diode is a perovskite material bypass diode, the PN junction can be conveniently manufactured by using the P-type perovskite material and the N-type perovskite material to form the perovskite material bypass diode. Moreover, the material of the perovskite material bypass diode is the same as the material of the perovskite material layer of the perovskite cell. The perovskite material bypass diode can be manufactured while manufacturing the perovskite material layer or the perovskite material bypass diode can be manufactured by using the perovskite material layer.

In terms of the quantity, a quantity of the at least one perovskite material bypass diode is equal to a quantity of the plurality of perovskite cells 10, the at least one perovskite material bypass diode 20 is connected in parallel with the plurality of perovskite cells 10 in a one to one corresponding way. At this moment, each perovskite cell 10 in the perovskite solar cell module can be configured with a perovskite material bypass diode 20. No matter which perovskite cell fails, it can be bypassed by its parallel perovskite material bypass diode 20, thereby the failed perovskite cell 10 is avoided from consuming electric energy. Based on this, the entire perovskite solar cell module can be performed being protected from failure.

Exemplarily, when the perovskite solar cell module includes 10 cascaded perovskite cells 10, the quantity of the perovskite material bypass diodes 20 is 10, and each perovskite cell 10 is connected in parallel with a perovskite material bypass diode 20.

In terms of the materials, a general formula of a perovskite material of each perovskite material bypass diode 20 is $ABX_3$, wherein A is a monovalent cation, B is a divalent cation, and X is a monovalent anion; and a content of AX of the P-type perovskite material region of the each perovskite material bypass diode 20 is greater than a content of $BX_2$ of the P-type perovskite material region of the perovskite material bypass diode, and a content of AX of the N-type perovskite material region of the each perovskite material bypass diode 20 is less than a content of $BX_2$ of the N-type perovskite material region of the each perovskite material bypass diode. At this moment, by adjusting the content of the AX and the content of the $BX_2$, the conducting type of the perovskite material can be conveniently adjusted, and then the PN junction structure of the perovskite material bypass diode 20 can be conveniently manufactured.

As shown in FIG. 1 to FIG. 4, in terms of the disposed position, each perovskite material bypass diode 20 is disposed between a positive electrode and a negative electrode of each perovskite cell 10. At this moment, the two electrodes of the perovskite material bypass diode 20 can be electrically contacted directly with the two electrodes of the perovskite cell 10 without the need of the auxiliary connection of other structures, thus the structure can be simplified.

It should be understood that between the positive electrode and the negative electrode of the perovskite cell 10, not only the functional structure of the perovskite material layer 14 is disposed, but also the perovskite material bypass diode 20 is disposed. That is to say, between the positive electrode and the negative electrode, the perovskite material bypass diode 20 and the perovskite material layer 14 are disposed side by side.

In terms of the connecting mode, the P-type perovskite material region of the perovskite material bypass diode 20 is electrically connected to the negative electrode of the perovskite cell 10, and the N-type perovskite material region of the perovskite material bypass diode 20 is electrically connected to the positive electrode of the perovskite cell 10. At this moment, the current direction of the perovskite material bypass diode 20 and the current direction of the perovskite cell 10 connected in parallel with the perovskite material bypass diode 20 are the same; the parallel connection of the perovskite material bypass diode 20 and the perovskite cell can be realized.

It can be understood that the P-type perovskite material region of the perovskite material bypass diode 20 stated above refers to the P region of the PN junction of the perovskite material bypass diode 20. The N-type perovskite material region of the perovskite material bypass diode 20 refers to the N region of the PN junction of the perovskite material bypass diode 20.

When it is specifically implemented, the P-type perovskite material region of the perovskite material bypass diode 20 located between the positive electrode and the negative electrode can be electrically contacted with the negative electrode, and the N-type perovskite material region of the perovskite material bypass diode 20 located between the positive electrode and the negative electrode can be electrically contacted with the positive electrode. Certainly, the P-type perovskite material region of the perovskite material bypass diode 20 can also be electrically contacted with the negative electrode through the carrier transport layer, and the N-type perovskite material region of the perovskite material bypass diode 20 can also be electrically contacted with the positive electrode through the carrier transport layer.

In terms of shape, a cross section of the perovskite material bypass diode 20 may be rectangular, may also be triangular or may also be trapezoidal. At this moment, the perovskite material bypass diodes 20 with different shapes and sizes can be disposed according to the circuit design of the perovskite solar cell module.

The cross section stated above refers to the section shape of the perovskite material bypass diode 20 obtained by cutting the perovskite material bypass diode 20 in a direction perpendicular to the thickness direction of the perovskite cell 10. The cross section is also a pattern of the orthographic projection of the perovskite material bypass diode 20 on the substrate 11 of the perovskite solar cell module.

The perovskite cell 10 stated above can be an N-I-P structure, and the perovskite cell can also be a P-I-N structure. Specifically, the perovskite cell 10 can include a substrate 11, a first electrode layer 12, a first carrier transport layer 13, a perovskite material layer 14, a second carrier transport layer 15 and a second electrode layer 16 successively arranged in layer configuration. The material of the perovskite material layer 14 is the perovskite material, and the general formula of the perovskite material is $ABX_3$, wherein A is at least one of $FA^+$, $MA^+$ or $Cs^+$, B is at least one of $Pb^{2+}$ or $Sn^{2+}$, and X is at least one of $Cl^-$, $Br^-$ or $I^-$. For the perovskite cell with the N-I-P structure, the first electrode layer 12 is a negative electrode, the second electrode layer 16 is a positive electrode, and the first carrier transport layer 13 is an electron transport layer, and the second carrier transport layer 15 is a hole transport layer. For the perovskite cell 10 with the P-I-N structure, the first electrode layer 12 is a positive electrode, the second electrode layer 16 is a negative electrode, and the first carrier transport layer 13 is a hole transport layer and the second carrier transport layer 15 is an electron transport layer.

Figure 4:
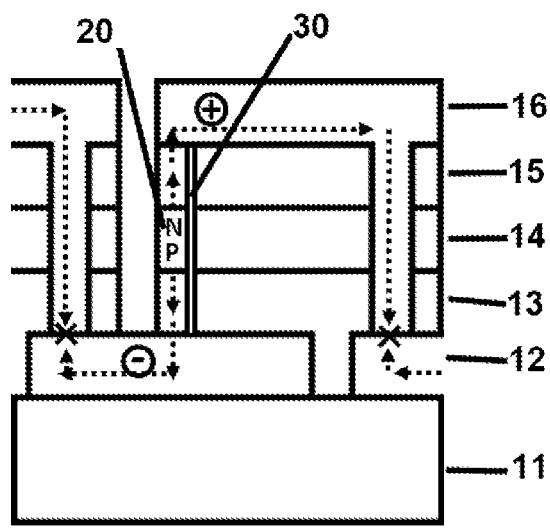
FIG. 4 is a schematic diagram of a structure of the perovskite solar cell module of the perovskite material bypass diode manufactured by the perovskite material layer according to the embodiments of the present application.

As shown in FIG. 4, in view of that a material of the perovskite material bypass diode and a material of the perovskite material layer 14 can be the same. Each perovskite material bypass diode 20 may be manufactured by heat treating an edge part of the perovskite material layer 14 of each perovskite cell 10. At this moment, during the manufacturing process of the perovskite cell 10, a part of the region can be separated from the perovskite material layer 14, by the post-processing, a perovskite material bypass diode 20 with a PN junction can be constructed in this part of the region. This method of manufacturing the perovskite material bypass diode 20 can be compatible with the existing scribing module process, it is only needed to add a few simple steps that the manufacturing of the perovskite material bypass diode 20 can be realized, and the process is simple and easy. Moreover, this method has less improvement on the existing process and the less increasing cost, and is convenient for production and application.

The edge region stated above refers to a part of the region close to the edge in the perovskite material layer 14 from the top view. The size of the edge part can be set according to the needs of the perovskite material bypass diode 20. It should be noted that the edge part occupied by the perovskite material bypass diode 20 should be as small as possible to ensure the area of the photoelectric conversion region of the perovskite material layer 14. After manufacturing the perovskite material bypass diode 20 is completed, the edge part of the perovskite material layer 14 becomes the perovskite material bypass diode 20, and the rest part of the perovskite material layer 14 is the perovskite material layer 14, the photoelectric conversion is realized.

As shown in FIG. 1 to FIG. 4, the perovskite solar cell module further includes an electric isolation wall 30, the electric isolation wall 30 is disposed between each perovskite material bypass diode 20 and the perovskite material layer 14 of each perovskite cell 10, wherein, a material of the electric isolation wall 30 may be a dielectric material, may also be a ceramic insulating material and may also be an organic insulating material. At this moment, the insulation isolation between the perovskite material bypass diode 20 and the perovskite material layer 14 can be better realized by using the electric isolation wall 30, the electric leakage of the perovskite material bypass diode and the perovskite material layer are avoided, and the bypass performance of the perovskite material bypass diode 20 can be improved.

Along a direction away from the substrate 11, a height of the electric isolation wall 30 should not be less than a thickness of the perovskite material layer 14, and the electric isolation wall 30 can at least block the contact between the perovskite material layer 14 and the perovskite material bypass diode 20.

Figure 5:
FIG. 5 to FIG. 14 are schematic diagrams of various stages of the manufacturing method of the perovskite solar cell module according to the embodiments of the present application.

A method for manufacturing a perovskite solar cell module is further provided by the embodiments of present application. As shown in FIG. 5 to FIG. 14, wherein the method for manufacturing the perovskite solar cell module includes steps as follows:

Step S100, as shown in FIG. 5, providing a substrate 11 having a conducting layer. The conducting layer is covered on the entire substrate 11. The substrate 11 may be glass, etc.

Figure 6:
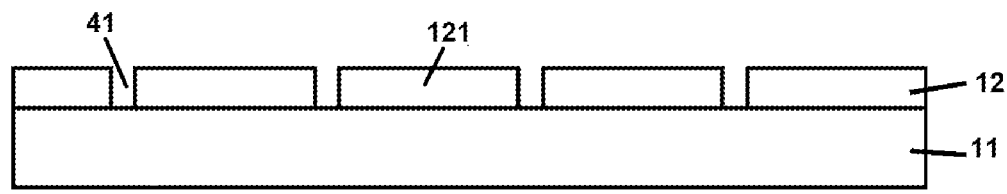

Step S200, as shown in FIG. 6, opening a first slot 41 running through the conducting layer on the substrate 11 and forming the first electrode layer 12. During this process, the conducting layer is split by the first slots 41 into a plurality of electrode blocks 121. At this moment, the first electrode layer 12 includes the plurality of electrode blocks 121 separately distributed on the substrate 11. The electrode blocks 121 are electrically separated from each other. Each electrode block 121 is the first electrode layer 12 of the perovskite cell 10. A quantity of the first slots 41 matches with a quantity of the electrode blocks 121. A width of the first slot 41 may be 10 μm-100 μm. For example, the width of the first slot 41 can be 10 μm, 20 μm, 30 μm, 40 μm, 50 μm, 60 μm, 70 μm, 80 μm, 90 μm, 100 μm, etc. It should be noted that in the embodiments of the present application, a width of slot refers to the distance between the two side walls of the slot.

Figure 7:
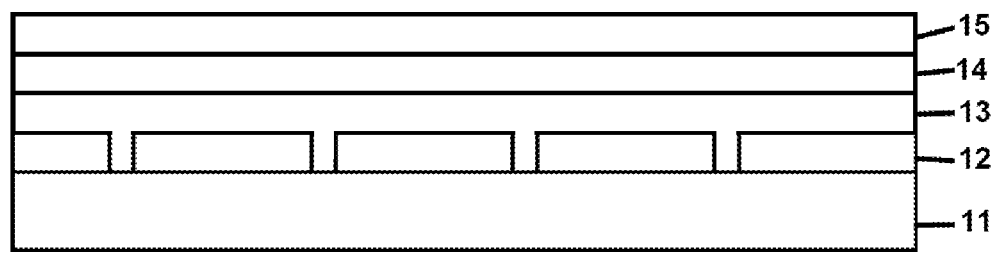

Step S300, as shown in FIG. 7, forming the function layer on the first electrode layer 12, wherein the function layer is covered on the plurality of electrode blocks 121 of the first electrode layer 12 and the substrate 11 between the plurality of electrode blocks 121. The function layer includes a perovskite material layer 14 and further includes a first carrier transport layer 13 and a second carrier transport layer 15. The first carrier transport layer 13 is located between the first electrode layer 12 and the perovskite material layer 14, and the second carrier transport layer 15 is located on the surface of the perovskite material layer 14 away from the first electrode layer 12. At this moment, the first carrier transport layer 13 and the second carrier transport layer 15 can be set according to the design needs of the perovskite cell 10.

Taking the function layer including the first carrier transport layer 13, the perovskite material layer 14 and the second carrier transport layer 15 as an example, the way of forming the function layer is: on the first electrode layer 12, the first carrier transport layer 13, the perovskite material layer 14 and the second carrier transport layer 15 are deposited successively. At this moment, the first carrier transport layer 13 not only covers the electrode block 121 of the first electrode layer 12, but also fills the first slot 41. It should be understood that the way of forming various layers included in the function layer can be selected according to the actual production.

The module base plate can be provided for the subsequent manufacturing steps by using the three steps stated above, the module base plate includes a substrate 11, a first electrode layer 12 and a function layer successively arranged in layer configuration. The first electrode layer 12 includes a plurality of electrode blocks 121 separately distributed on the substrate 11. The function layer at least includes the perovskite material layer 14.

Figure 8:
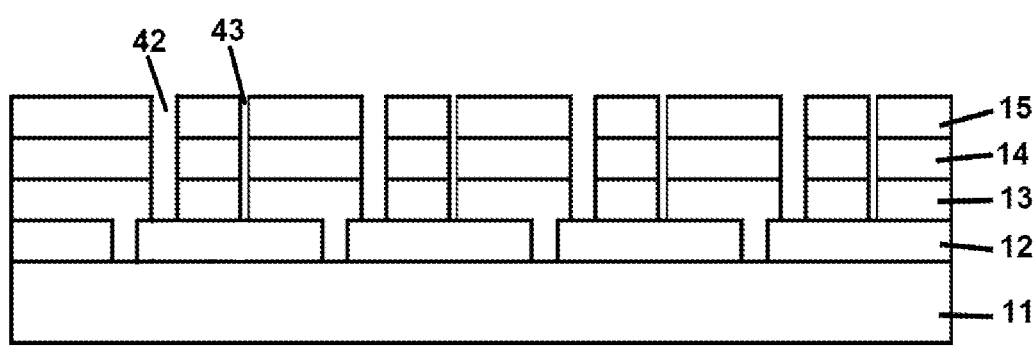
Figure 9:
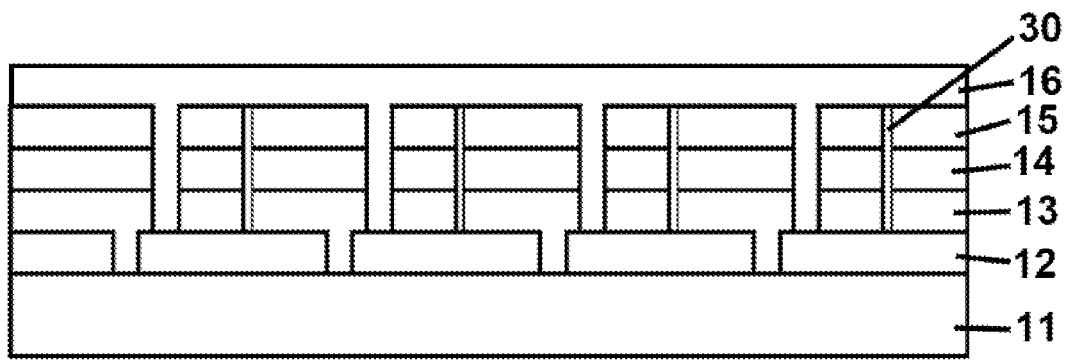

Step S400, as shown in FIG. 8 and FIG. 9, the series groove 42 is opened on the module base plate; at least one electric isolation wall 30 is formed on the module base plate; each electric isolation wall 30 is located in a region where the perovskite cell 10 is located, and a function layer of the perovskite cell 10 is divided into a cell region and a bypass diode region.

As shown in FIG. 8, the series groove 42 is used to fill the second electrode material in the subsequent process, so as to realize the series connection between the adjacent perovskite cells 10. The series groove 42 runs through the function layer and does not destroy the first electrode layer 12. The width of the series groove 42 can be 10 μm-100 μm, such as 10 μm, 20 μm, 40 μm, 50 μm, 70 μm, 90 μm, 100 μm and so on. The distance between the series groove 42 and the first slot 41 can be 5 μm-50 μm, such as 5 μm, 10 μm, 30 μm, 40 μm, 50 μm, etc.

The specific steps of forming the at least one electric isolation wall 30 on the module base plate include:

As shown in FIG. 8, the at least one electric isolation groove 43 is opened on the module base plate, wherein each electric isolation groove 43 runs through the function layer.

As shown in FIG. 9, an insulating material is filled in the each electric isolation groove 43 to form the each electric isolation wall 30; wherein a way of filling the insulating material is deposition, evaporation or printing. The insulating material can be the dielectric material, the ceramic insulating material or the organic insulating material. At this moment, by means of opening the electric isolation groove 43 and filling the insulating material, the function layer of the perovskite cell 10 can be conveniently divided into the bypass diode region and the cell region. Moreover, opening the electric isolation groove 43 and opening the series groove 42 can be carried out synchronously, and the process is simple and easy.

As shown in FIG. 8, the width of the electric isolation groove 43 can be 5 μm-50 μm, such as 5 μm, 10 μm, 20 μm, 30 μm, 40 μm, 50 μm, etc. The distance between the electric isolation groove 43 and the series groove 42 can be 20 μm-200 μm, such as 20 μm, 40 μm, 60 μm, 100 μm, 120 μm, 150 μm, 180 μm, 190 μm, 200 μm, etc. At this moment, the electric isolation wall 30 formed by the electric isolation groove 43 has enough width to play a better role in insulation isolation. Moreover, there is enough space between the electric isolation groove 43 and the series groove 42, which is convenient to dispose the separating groove 440 for dividing the perovskite cell 10.

It should be understood that in practical applications, a series groove 42 and an electric isolation groove 43 can be disposed on each electrode block 121. The series groove 42 can be opened first, and then electric isolation groove 43 can be opened. It may also be that the electric isolation groove 43 is opened first, and then the series groove 42 is opened. It may also be that the series groove 42 and the electric isolation groove 43 are opened at the same time. In addition, during the process of filling the insulating material, only the electric isolation groove 43 is filled with the insulating material.

Step S500, as shown in FIG. 9, forming the second electrode layer 16 filled in the series groove 42 on the module base plate. The second electrode layer 16 is filled in the series groove 42 to realize the electrical connection between the second electrode layer 16 and the first electrode layer 12. Moreover, the second electrode layer 16 is covered on the surface of the function layer. The material of the second electrode layer 16 is a material with good electrical conductivity. At this moment, the first electrode layer 12 is a positive electrode and the second electrode layer 16 is a negative electrode. Or, the first electrode layer 12 is a negative electrode, the second electrode layer 16 is a positive electrode.

Figure 10:
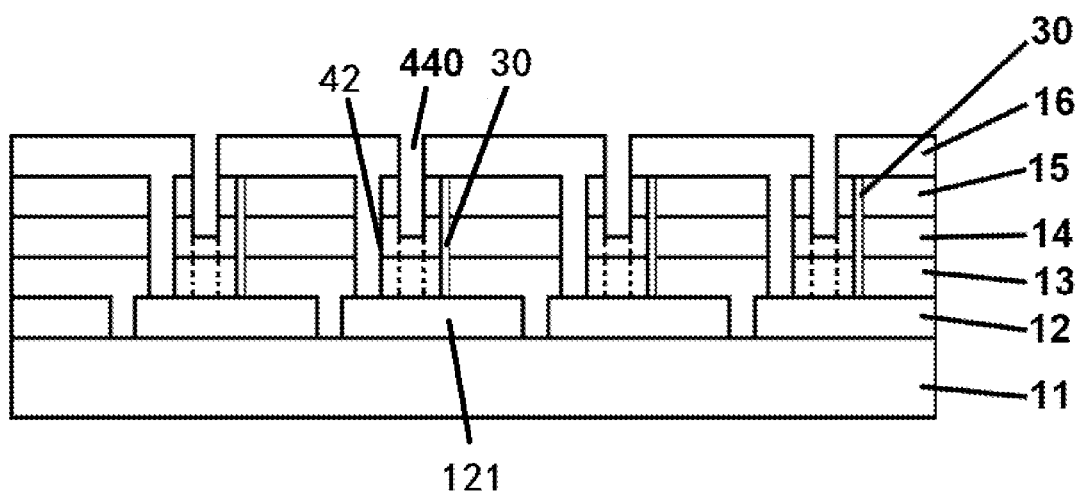

Step 600, as shown in FIG. 10, partially exposing the perovskite material layer. The specific ways are as follows: opening a separating groove 440 separating adjacent perovskite cells 10 on the second electrode layer 16, extending the separating groove 440 to an interior of the perovskite material layer 14, so that each bypass diode region is partially exposed.

On a same electrode block 121, the separating groove 440 is located between the series groove 42 and the electric isolation wall 30. At this moment, while separating the two perovskite cells 10, the separating groove 440 separates the series groove 42 of the former perovskite cell from the perovskite material bypass diode 20 of the latter perovskite cell 10.

A depth of the separating groove 440 extending to the interior of the perovskite material layer 14 is greater than or equal to 30% of a thickness value of the perovskite material layer 14 and less than or equal to 70% of the thickness value of the perovskite material layer 14. The thickness value of the perovskite material layer 14 refers to a height value of the perovskite material layer 14 located above the first electrode layer 12, excluding the part of the height of the perovskite material layer 14 that may be located in the first slot 41. Specifically, the depth of the separating groove 440 extending to the interior of the perovskite material layer 14 is aligned at the positions of 30%, 35%, 40%, 45%, 50%, 56%, 58%, 60%, 65%, and 70% of the thickness value of the perovskite material layer 14. At this moment, the bypass diode region is divided into two parts, one part is exposed and the other part is still shielded by a material of the bottom of the separating groove 440. These two parts correspond to the P region and the N region of the perovskite material bypass diode 20, respectively. Moreover, when the separating groove 440 is extended to 30%-70% of the thickness of the perovskite material layer 14, the volume difference between the P region and the N region is small, a PN junction with a better function can be ensured to be formed, and the dysfunction caused by the large volume difference is avoided.

A width of the separating groove 440 stated above ranges from 10 μm to 100 μm, such as 10 μm, 20 μm, 40 μm, 50 μm, 60 μm, 70 μm, 90 μm, 100 μm, etc.

Figure 11:
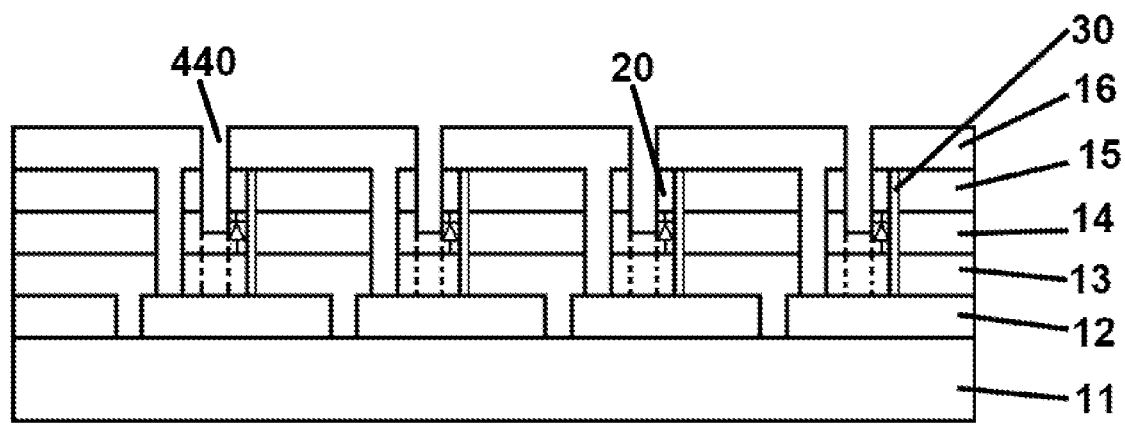

Step S700, as shown in FIG. 11, processing an exposed part of the perovskite material layer 14 to form a P-type perovskite material region and an N-type perovskite material region, so that the perovskite material bypass diode 20 is formed. The exposed part of the perovskite material layer 14 is the exposed part of the perovskite material layer 14 of the bypass diode region.

The material of the perovskite material layer of the bypass diode region is the $ABX_3$ perovskite material, which is composed of the AX and the $BX_2$ according to a certain stoichiometric ratio. Wherein A can be at least one of ions of $FA^+$, $MA^+$ or $Cs^+$, B can be at least one of ions of $Pb^{2+}$ or $Sn^{2+}$, and X can be at least one of $Cl^-$, $Br^-$ or $I^-$.

Processing the exposed part of the perovskite material layer 14 includes:

increasing a content of AX of the exposed part of the perovskite material layer 14 of the bypass diode region, so that the exposed part of the perovskite material layer 14 of the bypass diode region is transformed into the P-type perovskite material; or reducing the content of the AX of the exposed part of the perovskite material layer 14 of the bypass diode region, so that the exposed part of the perovskite material layer 14 of the bypass diode region is transformed into the N-type perovskite material. In view of that the ratio of the AX to the $BX_2$ in the perovskite material can be used to adjust the conducting type of the perovskite material, by using the way of changing the content of the AX, the ratio of the AX to the $BX_2$ can be conveniently adjusted to form the PN junction.

Processing the exposed part of the perovskite material layer 14 includes: heating the exposed part of the perovskite material layer 14 of the bypass diode region to form the N-type perovskite material region of the perovskite material bypass diode 20; or in an AX atmosphere 50, heat treating the exposed part of the perovskite material layer 14 of the bypass diode region to form the P-type perovskite material region of the perovskite material bypass diode 20. In view of that the binding force of the AX in the perovskite lattice is not too strong, the AX can be released from the perovskite material by the way of heating to form the N-type perovskite material. By heat treating in the AX atmosphere 50, the AX can be injected into the perovskite material to form the P-type perovskite material. By treating the exposed part of the perovskite material layer 14 of the bypass diode region, the PN junction can be easily and quickly manufactured.

Figure 12:
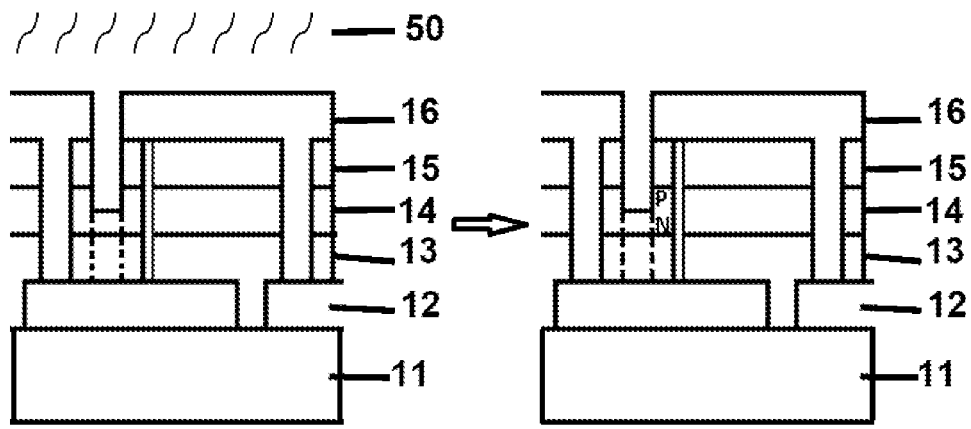

Exemplarily, as shown in FIG. 12, when the perovskite material layer 14 is an N-type perovskite material, the formed module base plate with the separating groove 440 can be heat-treated in the AX atmosphere 50. The AX is diffused from the exposed part of the perovskite material layer 14 in the bypass diode region and injected into the upper part of the perovskite material, so that the upper part of the exposed perovskite material becomes the P-type perovskite material. Thus, the PN junction of the perovskite material bypass diode 20 in FIG. 12 is formed. At this moment, the formed upper side of the perovskite material bypass diode 20 is the P region, and the lower side is the N region. This perovskite material bypass diode 20 can be manufactured on the perovskite cell 10 with the P-I-N structure.

Figure 13:
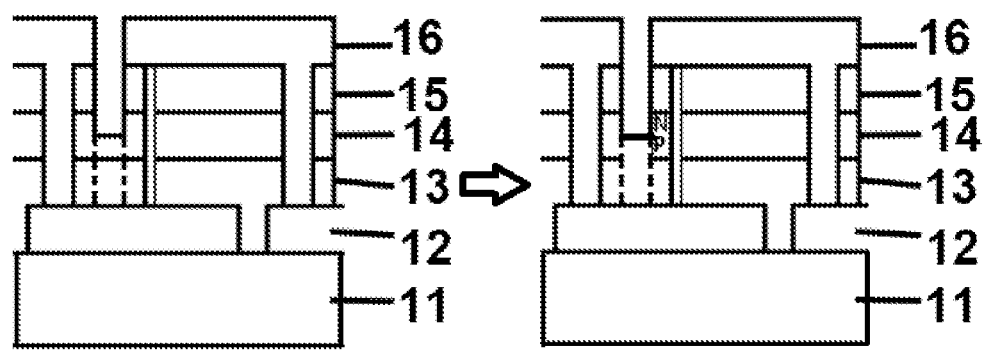

Exemplarily, as shown in FIG. 13, when the perovskite material layer 14 is a P-type perovskite material, after forming the separating groove 440, the exposed part of the perovskite material layer 14 of the bypass diode region can be heated, so that the AX of the exposed part of the perovskite material layer 14 of the bypass diode region partially overflows from the perovskite material. After the heating treatment, the perovskite material of the upper part of the bypass diode region is transformed into the N-type perovskite material, thus the PN junction of the perovskite material bypass diode 20 is formed as shown in FIG. 13. At this moment, the formed upper side of the perovskite material bypass diode 20 is the N region, and the lower side is the P region. This perovskite material bypass diode 20 can be manufactured on the perovskite cell 10 with the N-I-P structure.

Figure 14:
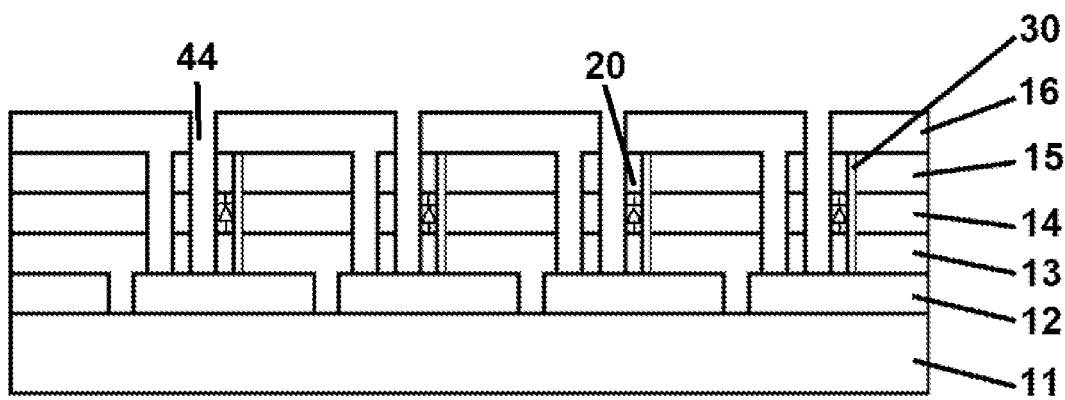

Step 800, as shown in FIG. 14, deepening the separating groove 440 to make the separating groove 440 form the second slot 44 to form the perovskite solar cell module. The second slot 44 formed after deepening the separating groove 440 runs through the second electrode layer 16 and the function layer without destroying the first electrode layer 12. At this moment, the perovskite material bypass diode 20 is connected in parallel with the perovskite cell of the perovskite solar cell module in a one to one corresponding way.

The methods of opening the first slot 41, opening the series groove 42, opening the electric isolation groove 43, opening the separating groove 440 and deepening the separating groove 440 stated above are selected from chemical etching, laser scribing cutting or mechanical scribing.

In a word, in the process of manufacturing the perovskite material bypass diode 20 in the embodiments of the present application, the process of opening the electric isolation groove 43 can be carried out simultaneously with the process of opening the series groove 42 in the existing process by using a same process. The process of filling insulating material can be well compatible with the process of forming the second electrode layer 16. Based on this, on the one hand, the process steps can be simplified and the manufacturing difficulty is reduced. On the other hand, the improvement of the existing process is small, the improvement cost can be reduced and the production application is facilitated. The second slot 44 opened at one time in the prior art is divided into two steps in the embodiments of the present application, firstly, the separating groove 440 extending to the interior of the perovskite material layer 14 is opened, then the separating groove 440 is deepened. In this process, by using the separating groove 440, the perovskite material bypass diode 20 is divided into two parts, thus only a part of the perovskite material bypass diode 20 can be processed to form the perovskite material bypass diode 20 with the PN junction. Opening the second slot 44 in two steps may not affect the second slot 44 and the perovskite solar cell module. This method of forming the perovskite material bypass diode 20 is better combined with the existing scribing series process, and the original step of forming the second slot 44 is slightly improved to form the perovskite material bypass diode 20. In this case, not only the manufacturing process is simple, the manufacturing difficulty is low, the production application is facilitated, but also the improvement cost of the existing process is small.

A photovoltaic module is further provided by the embodiments of the present application, the photovoltaic module includes at least one of the perovskite solar cell module stated above.

Specifically, the photovoltaic module can be the photovoltaic module formed by that a plurality of perovskite solar cell modules are electrically connected on a substrate. The photovoltaic module may also be the photovoltaic module formed by that a plurality of perovskite solar cell modules are connected in series and in parallel by a welding strip.

In order to further elaborate the perovskite solar cell module, the specific embodiments of the perovskite solar cell module and the manufacturing method therefor are further provided by the present application.

Embodiment 1

In the present embodiment, the perovskite solar cell module is manufactured by using the ITO conductive glass with length, width and thickness of 600 mm×600 mm×2.2 mm as the substrate.

In the first step, a first slot is formed on the ITO conductive glass. The first slots with a width of 50 μm are set every 10 mm on the conductive surface of the ITO conductive glass by using the laser etching to form the first electrode layer.

In the second step, the $TiO_2$ electron transport layer (with a thickness of 50 nm), P-type $FAPbI_3$ perovskite material layer (with a thickness of 1000 nm) and the Spiro-OMeTAD hole transport layer (with a thickness of 150 nm) are manufactured on the substrate with the first slot.

In the third step, the series groove (with a width of 50 μm) and the electric isolation groove (with a width of 20 μm) are opened by using the laser etching, wherein a distance between the series groove and the first slot is 10 μm, a distance between the electric isolation groove and the series groove is 50 μm; and then the $ZrO_2$ insulating material is filled in the electric isolation groove.

In the fourth step, after filling the insulating material, an Au thin film with a thickness of 100 nm is manufactured and regarded as the second electrode layer, and then the separating groove is opened by using the laser etching.

In the fifth step, the substrate with the separating groove is heated at 80° C. for 5 h in an inert atmosphere, so that a part of the FAI in the exposed part of the perovskite material layer of the bypass diode region escapes from the perovskite material, so that the upper part of the bypass diode region forms an N-type region of the perovskite material bypass diode. The perovskite material bypass diode is obtained.

In the sixth step, by using the laser etching, the depth of the separating groove is etched from the internal position of the perovskite material layer to the position at the interface between the ITO layer and the electron transport layer, and the perovskite solar cell module is completely manufactured.

Embodiment 2

In the present embodiment, the perovskite solar cell module is manufactured by using the ITO conductive glass with length, width and thickness of 600 mm×600 mm×2.2 mm as the substrate.

In the first step, a first slot is formed on the ITO conductive glass. The first slots with a width of 50 μm are set every 10 mm on the conductive surface of the ITO conductive glass by using the laser etching to form the first electrode layer.

In the second step, the $PC_{61}BM$ hole transport layer (with a thickness of 150 nm), P-type $FAPbI_3$ perovskite material layer (with a thickness of 1000 nm) and the NiO electron transport layer (with a thickness of 50 nm) are manufactured on the substrate with the first slot.

In the third step, the series groove (with a width of 50 μm) and the electric isolation groove (with a width of 20 μm) are opened by using the laser etching, wherein a distance between the series groove and the first slot is 10 μm, a distance between the electric isolation groove and the series groove is 50 μm; and then the $ZrO_2$ insulating material is filled in the electric isolation groove.

In the fourth step, after filling the insulating material, an Au thin film with a thickness of 100 nm is manufactured and regarded as the second electrode layer, and then the separating groove is opened by using the laser etching.

In the fifth step, the substrate with the separating groove is heated at 80° C. for 5 h in an FAI atmosphere, during the heating process, the FAI is injected into the exposed part of the perovskite material layer of the bypass diode region, so that the upper part of the bypass diode region forms an P-type region of the perovskite material bypass diode. The perovskite material bypass diode is obtained.

In the sixth step, by using the laser etching, the depth of the separating groove is etched from the internal position of the perovskite material layer to the position at the interface between the ITO layer and the electron transport layer, and the perovskite solar cell module is completely manufactured.

The perovskite solar cell modules manufactured by the embodiment 1 and the embodiment 2 are tested. During the process of the testing, the perovskite material of the perovskite material layer of one of the perovskite cells is destroyed, so that the perovskite solar cell module is invalid. Subsequently, the conversion efficiency of the perovskite solar cell module is tested and compared with the perovskite solar cell module without setting the perovskite material bypass diode. The results show that the conversion efficiencies of the perovskite solar cell modules manufactured by the embodiment 1 and the embodiment 2 are significantly higher than the conversion efficiency of the perovskite solar cell module without setting the perovskite material bypass diode.

Although this application is described here by combining the embodiments, in the course of carrying out the application for the protection required, a person skilled in the art can understand and realize other changes in the disclosed embodiment by looking at the drawings, the disclosed contents and the claims. In a claim, the term "including" does not exclude other components or steps, and "a" or "an" does not exclude multiple situations. Different dependent claims contain certain measures, but this does not mean that these measures cannot be combined to produce good effects.

Although the present application has been described with reference to the particular features and the embodiments thereof, apparently, they may have various modifications and combinations without departing from the spirit and scope of the present application. Correspondingly, the description and the drawings are merely illustrative description on the present application defined by the appended claims, and are deemed as having already covered any and all of modifications, variations, combinations and equivalents within the scope of the present application. Apparently, a person skilled in the art may make various modifications and variations on the present application without departing from the spirit and the scope of the present application. Accordingly, if those modifications and variations on the present application fall within the scope of the claims of the present application and equivalents thereof, then the present application is also intended to encompass those modifications and variations.

The invention claimed is:

1. A method for manufacturing a perovskite material bypass diode, wherein the method comprises: providing a layer of a perovskite material layer, processing the perovskite material layer to form a P-type perovskite material region and an N-type perovskite material region, so that a perovskite material bypass diode is formed.

2. The method for manufacturing the perovskite material bypass diode according to claim 1, wherein a general formula of a perovskite material of the perovskite material layer is $ABX_3$, wherein A is a monovalent cation, B is a divalent cation, and X is a monovalent anion; and
a content of AX of the P-type perovskite material region is greater than a content of $BX_2$ of the P-type perovskite material region, and a content of AX of the N-type perovskite material region is less than a content of $BX_2$ of the N-type perovskite material region.

3. The method for manufacturing the perovskite material bypass diode according to claim 1, wherein the step of processing the perovskite material layer comprises:
heating a local part of the perovskite material layer to form the N-type perovskite material region, and/or in an AX atmosphere, heat treating the local part of the perovskite material layer to form the P-type perovskite material region.

4. The perovskite material bypass diode obtained by using the method for manufacturing the perovskite material bypass diode according to claim 1.

5. A perovskite solar cell module, wherein the perovskite solar cell module comprises a plurality of perovskite cells connected in series and at least one perovskite material bypass diode connected in parallel with the plurality of the perovskite cells; wherein the at least one perovskite material bypass diode is obtained by processing a perovskite material layer to form a P-type perovskite material region and an N-type perovskite material region.

6. The perovskite solar cell module according to claim 5, wherein a quantity of the at least one perovskite material bypass diode is equal to a quantity of the plurality of perovskite cells, the at least one perovskite material bypass diode is connected in parallel with the plurality of perovskite cells in a one to one corresponding way.

7. The perovskite solar cell module according to claim 5, wherein a general formula of a perovskite material of each perovskite material bypass diode is $ABX_3$, wherein A is a monovalent cation, B is a divalent cation, and X is a monovalent anion; and
a content of AX of the P-type perovskite material region of the each perovskite material bypass diode is greater than a content of $BX_2$ of the P-type perovskite material region of the each perovskite material bypass diode, and a content of AX of the N-type perovskite material region of the each perovskite material bypass diode is less than a content of $BX_2$ of the N-type perovskite material region of the each perovskite material bypass diode.

8. The perovskite solar cell module according to claim 5, wherein each perovskite material bypass diode is disposed between a positive electrode and a negative electrode of each perovskite cell;
the P-type perovskite material region of the each perovskite material bypass diode is electrically connected to the negative electrode of the each perovskite cell, and the N-type perovskite material region of the each perovskite material bypass diode is electrically connected to the positive electrode of the each perovskite cell; and/or
a cross section of the each perovskite material bypass diode is rectangular, triangular or trapezoidal.

9. The perovskite solar cell module according to claim 5, wherein the perovskite solar cell module further comprises an electric isolation wall, the electric isolation wall is disposed between each perovskite material bypass diode and a perovskite material layer of each perovskite cell, wherein, a material of the electric isolation wall comprises any one of a dielectric material, a ceramic insulating material or an organic insulating material.

10. The perovskite solar cell module according to claim 5, wherein each perovskite material bypass diode is manufactured by heat treating an edge part of a perovskite material layer of each perovskite cell.

11. A method for manufacturing a perovskite solar cell module, wherein the method comprises steps as follows:
providing a module base plate, wherein the module base plate comprises a function layer, the function layer comprises a perovskite material layer;
partially exposing the perovskite material layer, and processing an exposed part of the perovskite material layer to form a P-type perovskite material region and an N-type perovskite material region, so that a perovskite material bypass diode is formed;

wherein the perovskite material bypass diode is connected in parallel with a perovskite cell of the perovskite solar cell module.

12. The method for manufacturing the perovskite solar cell module according to claim 11, wherein the perovskite material bypass diode is connected in parallel with the perovskite cell of the perovskite solar cell module in a one to one corresponding way.

13. The method for manufacturing the perovskite solar cell module according to claim 11, wherein after providing the module base plate and before partially exposing the perovskite material layer, the method for manufacturing the perovskite solar cell module further comprises: opening a series groove on the module base plate; forming at least one electric isolation wall on the module base plate; each electric isolation wall being located in a region where a perovskite cell is located, and dividing a function layer of the perovskite cell into a cell region and a bypass diode region, and then forming a second electrode layer filling the series groove on the module base plate; and partially exposing the perovskite material layer comprises: opening a separating groove separating adjacent perovskite cells on the second electrode layer, extending the separating groove to an interior of the perovskite material layer, so that the perovskite material layer of each bypass diode region is partially exposed.

14. The method for manufacturing the perovskite solar cell module according to claim 13, wherein forming the at least one electric isolation wall on the module base plate comprises:

opening at least one electric isolation groove on the module base plate, wherein each electric isolation groove runs through the function layer;

filling an insulating material in the each electric isolation groove to form the each electric isolation wall;

wherein a way of filling the insulating material is deposition, evaporation or printing; and a way of opening the series groove and a way of opening the at least one electric isolation groove are selected from chemical etching, laser scribing cutting or mechanical scribing.

15. The method for manufacturing the perovskite solar cell module according to claim 14, wherein a width of the series groove ranges from 10 μm to 100 μm, a width of each electric isolation groove ranges from 5 μm to 50 μm; a distance between the each electric isolation groove and the series groove ranges from 20 μm to 200 μm.

16. The method for manufacturing the perovskite solar cell module according to claim 13, wherein on a same electrode block, the separating groove is located between the series groove and the electric isolation wall; and/or a depth of the separating groove extending to the interior of the perovskite material layer is greater than or equal to 30% of a thickness value of the perovskite material layer and less than or equal to 70% of the thickness value of the perovskite material layer; and/or a width of the separating groove ranges from 10 μm to 100 μm.

17. The method for manufacturing the perovskite solar cell module according to claim 13, wherein a general formula of a perovskite material of the perovskite material layer is $ABX_3$, wherein A is a monovalent cation, B is a divalent cation, and X is a monovalent anion; and the exposed part of the perovskite material layer is the exposed part of the perovskite material layer of the bypass diode region;

processing the exposed part of the perovskite material layer comprises:

increasing a content of AX of the exposed part of the perovskite material layer of the bypass diode region, or reducing the content of the AX of the exposed part of the perovskite material layer of the bypass diode region.

18. The method for manufacturing the perovskite solar cell module according to claim 17, wherein processing the exposed part of the perovskite material layer comprises:

heating the exposed part of the perovskite material layer of the bypass diode region to form the N-type perovskite material region of the perovskite material bypass diode; or in an AX atmosphere, heat treating the exposed part of the perovskite material layer of the bypass diode region to form the P-type perovskite material region of the perovskite material bypass diode.

19. The method for manufacturing the perovskite solar cell module according to claim 13, wherein after forming the perovskite material bypass diode, the method for manufacturing the perovskite solar cell module further comprises: deepening the separating groove to form the perovskite solar cell module.

20. A photovoltaic module, wherein the photovoltaic module comprises the perovskite solar cell module according to claim 5.

* * * * *